United States Patent
Kobayashi (10) Patent No.: US 8,234,602 B2
(45) Date of Patent: Jul. 31, 2012

(54) SEMICONDUCTOR-DEVICE MANUFACTURING METHOD

(75) Inventor: Yuji Kobayashi, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 384 days.

(21) Appl. No.: 12/533,592

(22) Filed: Jul. 31, 2009

(65) Prior Publication Data

US 2010/0159617 A1 Jun. 24, 2010

(30) Foreign Application Priority Data

Dec. 24, 2008 (JP) ................. 2008-328464

(51) Int. Cl.
*G06F 17/50* (2006.01)

(52) U.S. Cl. ............... 716/56; 716/50; 716/51; 716/52; 716/54; 716/55; 430/5; 430/30

(58) Field of Classification Search ............... 716/50–56; 430/5, 30
See application file for complete search history.

(56) References Cited

U.S. PATENT DOCUMENTS

| | | | |
|---|---|---|---|
| 7,268,054 B2 | 9/2007 | Tran et al. | |
| 7,629,259 B2 * | 12/2009 | Sadjadi | 438/717 |
| 8,072,601 B2 * | 12/2011 | Fukuhara et al. | 356/401 |
| 2008/0003705 A1 | 1/2008 | Cho et al. | |
| 2008/0197394 A1 * | 8/2008 | Caspary et al. | 257/300 |
| 2008/0235650 A1 * | 9/2008 | Ito et al. | 716/19 |

FOREIGN PATENT DOCUMENTS

JP 2002-280388 9/2002

\* cited by examiner

*Primary Examiner* — Thuan Do
*Assistant Examiner* — Nha Nguyen
(74) *Attorney, Agent, or Firm* — Oblon, Spivak, McClelland, Maier & Neustadt, L.L.P.

(57) ABSTRACT

A semiconductor-device manufacturing method includes steps of performing a sidewall fabrication thereby forming a first pattern structure; measuring an amount of displacement of line portions of the first pattern structure; correcting an overlay specification for an overlay of the first pattern structure and a second pattern structure dynamically based on the amount of displacement; and determining whether an error in the overlay of the first pattern structure and the second pattern structure meets the corrected overlay specification.

18 Claims, 11 Drawing Sheets

SEMICONDUCTOR-DEVICE MANUFACTURING METHOD

CROSS-REFERENCE TO RELATED APPLICATIONS

This application is based upon and claims the benefit of priority from the prior Japanese Patent Application No. 2008-328464, filed on Dec. 24, 2008; the entire contents of which are incorporated herein by reference.

BACKGROUND OF THE INVENTION

1. Field of the Invention

The present invention relates to a semiconductor-device manufacturing method and an exposure method.

2. Description of the Related Art

As one of conventional techniques for forming a line-and-space pattern with a pitch finer than a resolution limit in an exposure technique, a technique for a sidewall fabrication process has been developed (for example, see Japanese Patent Application Laid-open No. 2002-280388). However, in the line-and-space pattern formed by the sidewall fabrication process, displacement of line portions may occur due to a shape error of core members used to form a sidewall layer. When a pattern B is formed by being overlaid with an underlying pattern A formed by sidewall fabrication, in conventional techniques, even if displacement due to the sidewall fabrication process occurs in the underlying pattern A, the flow advances to a subsequent process if an overlay error of the underlying pattern A and the pattern B meets a predetermined overlay specification. If the displacement in the underlying pattern A is not considered, there is a high possibility of causing yield degradation. Furthermore, if the overlay specification for the overlay error of the underlying pattern A and the pattern B is uniformly tightened by adding an amount of possible displacement in the underlying pattern A due to the sidewall fabrication, an exposure device having a high overlay accuracy is required, which results in an increase in cost. Moreover, tightening of the overlay specification leads to a drop in reworking rate. Consequently, a reduction of productivity has become a problem.

BRIEF SUMMARY OF THE INVENTION

A semiconductor-device manufacturing method according to an embodiment of the present invention comprises: forming a first layer including a line portion and a space portion with a first pitch; forming a second layer on each of side walls of the line portion of the first layer; removing the first layer thereby making the second layer into the one including line portions and space portions with a second pitch smaller than the first pitch; forming a first pattern structure including line portions and space portions with the second pitch; measuring an amount of displacement of the line portions of the first pattern structure based on a width of each of a first space portion and a second space portion out of the space portions of the first pattern structure, the first space portion being derived from the space portion of the first layer, and the second space portion being derived from the line portion of the first layer; correcting an overlay specification for an overlay of the first pattern structure and a second pattern structure formed to be overlaid above the first pattern structure dynamically based on the amount of displacement; and determining whether an error in the overlay of the first pattern structure and the second pattern structure meets corrected overlay specification.

A semiconductor-device manufacturing method according to an embodiment of the present invention comprises: forming a sacrifice layer including a line portion and a space portion with a first pitch above a lower layer to be processed; forming a sidewall layer on each of side walls of the line portion of the sacrifice layer; removing the sacrifice layer thereby making the sidewall layer into the one including line portions and space portions with a second pitch smaller than the first pitch; patterning the lower layer by using the sidewall layer as a mask thereby forming a first pattern structure of the lower layer including line portions and space portions with the second pitch; measuring an amount of displacement of the line portions of the first pattern structure based on a width of each of a first space portion and a second space portion out of the space portions of the first pattern structure, the first space portion being derived from the space portion of the sacrifice layer, and the second space portion being derived from the line portion of the sacrifice layer; correcting an overlay specification for an overlay of the first pattern structure and a second pattern structure formed to be overlaid above the first pattern structure dynamically based on the amount of displacement; forming a upper layer to be processed above the first pattern structure; forming a resist above the upper layer; patterning the resist thereby forming the second pattern structure; determining whether an error in the overlay of the first pattern structure and the second pattern structure meets corrected overlay specification; and transferring a pattern of the second pattern structure onto the upper layer by using the resist as a mask if the error meets the corrected overlay specification.

An exposure method according to an embodiment of the present invention comprises: measuring an amount of displacement of line portions of a first pattern structure, the first pattern structure including the line portions and space portions; correcting an overlay specification for an overlay of the first pattern structure and a second pattern structure formed to be overlaid above the first pattern structure dynamically based on the amount of displacement; and performing an exposure for forming the second pattern structure with an exposure device selected from a plurality of exposure devices depending on corrected overlay specification.

DETAILED DESCRIPTION OF THE INVENTION

Exemplary embodiments of the present invention are explained in detail below with reference to the accompanying drawings.

Figure 1:
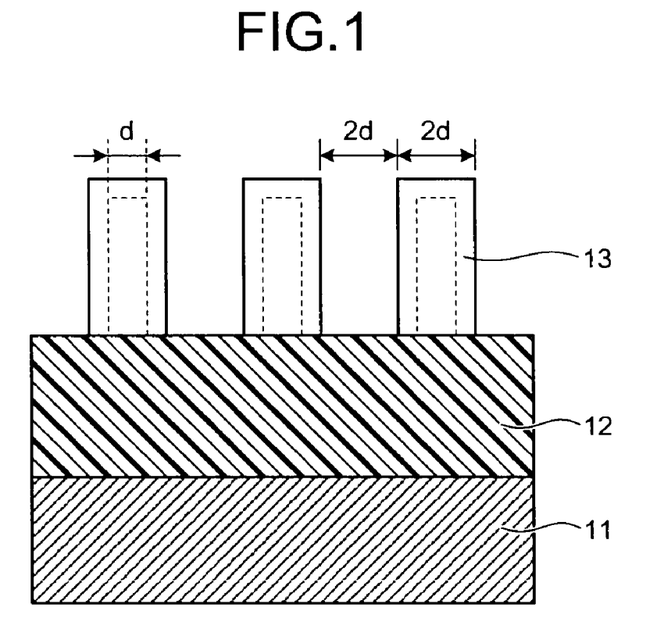
FIGS. 1 to 7 are schematic cross-sectional views for explaining a procedure of a sidewall fabrication process.

FIGS. 1 to 7 are schematic cross-sectional views for explaining a procedure of a sidewall fabrication process included in a semiconductor-device manufacturing process. In this example shown in FIGS. 1 to 7, a wiring pattern including line portions made of a wiring material is formed by the sidewall fabrication process. In a process shown in FIG. 1, a sacrifice layer 12 and a resist layer 13 are formed on a substrate on which a layer 11 to be processed (a lower layer to be processed), which is made of a wiring material, has been formed. Then, the resist layer 13 is patterned as shown in FIG. 1. When a line width of a desired wiring pattern is denoted by d, both a line width and a space width of the resist layer 13 shall be 2d.

Figure 2:
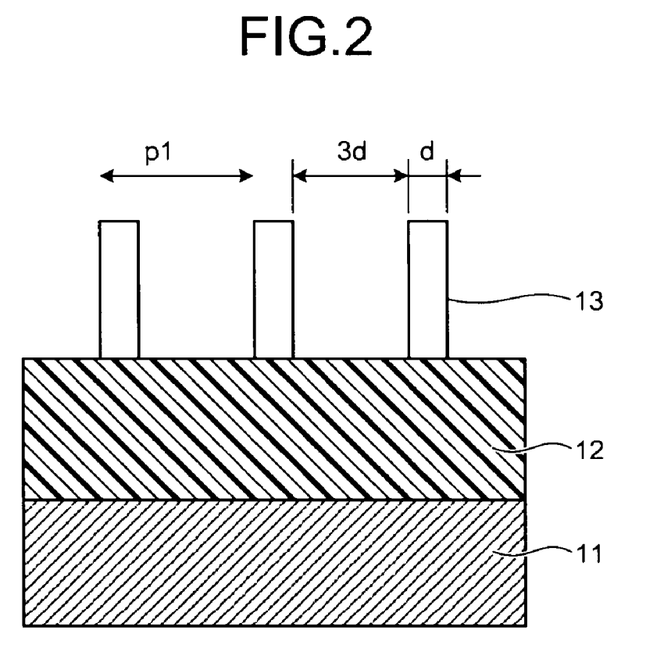
Figure 3:
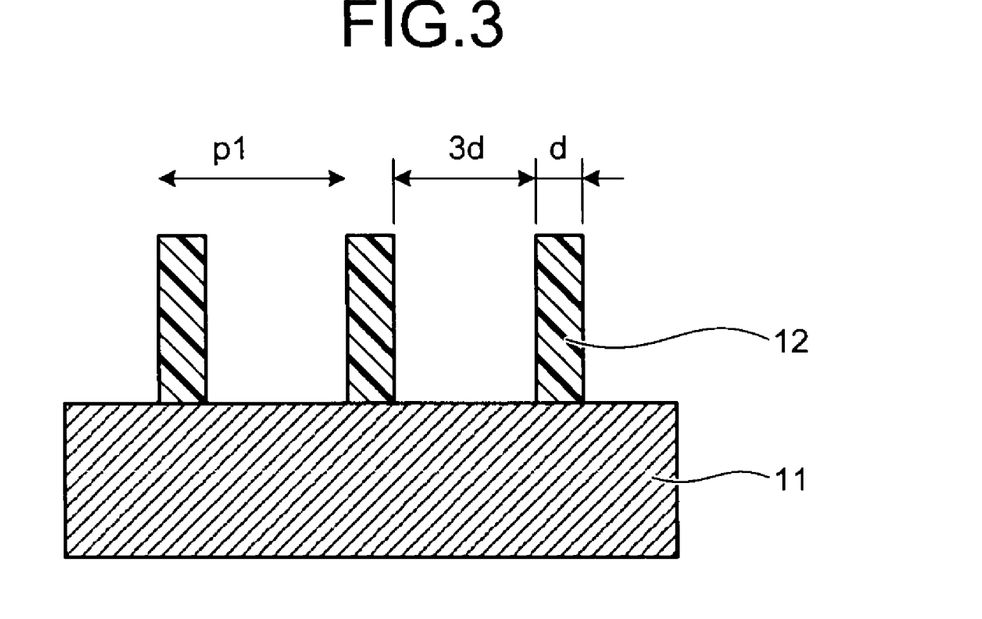

In a process shown in FIG. 2, the resist layer 13 is slimmed down until the line width of the resist layer 13 is down to the half of 2d, i.e., down to d. By the slimming process, the line width and the space width of the resist layer 13 become d and 3d, respectively. A pitch of one line portion and one space portion of the resist layer 13 shall be referred to as a first pitch p1. The first pitch p1 corresponds to a width 4d. Incidentally, without the slimming process, the resist layer 13 can be directly patterned to have the line width d and the space width 3d. The slimming process is useful when it is difficult to form the pattern having the line width d and the space width 3d directly. In a process shown in FIG. 3, the sacrifice layer 12 is patterned by using the resist layer 13 as a mask. As a result, the sacrifice layer 12 including line portions and space portions with the first pitch p1 (a first layer) is formed.

Figure 4:
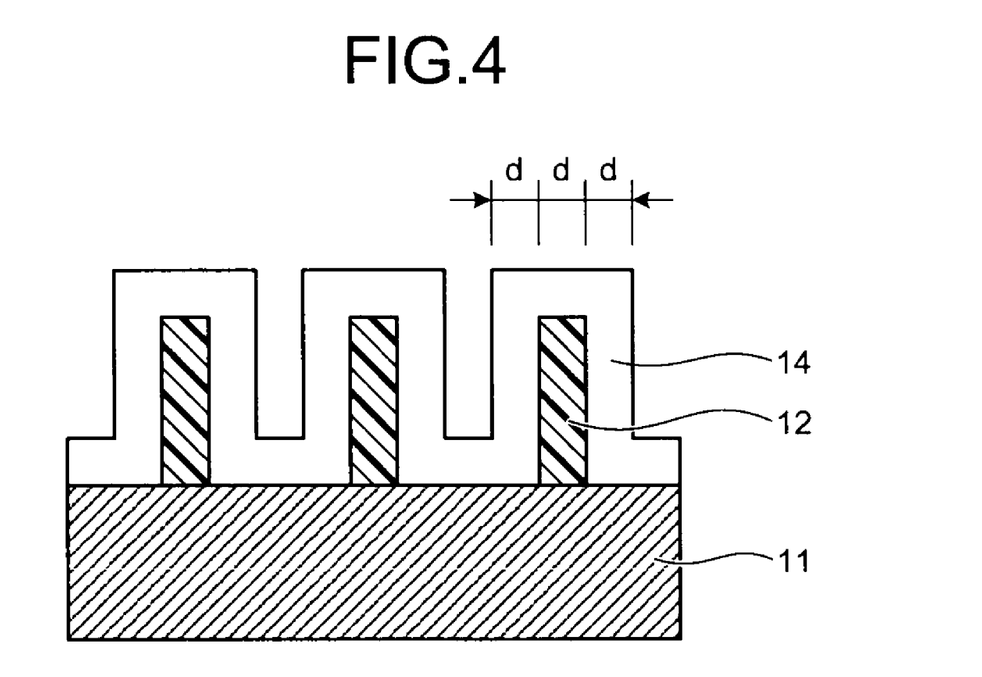
Figure 5:
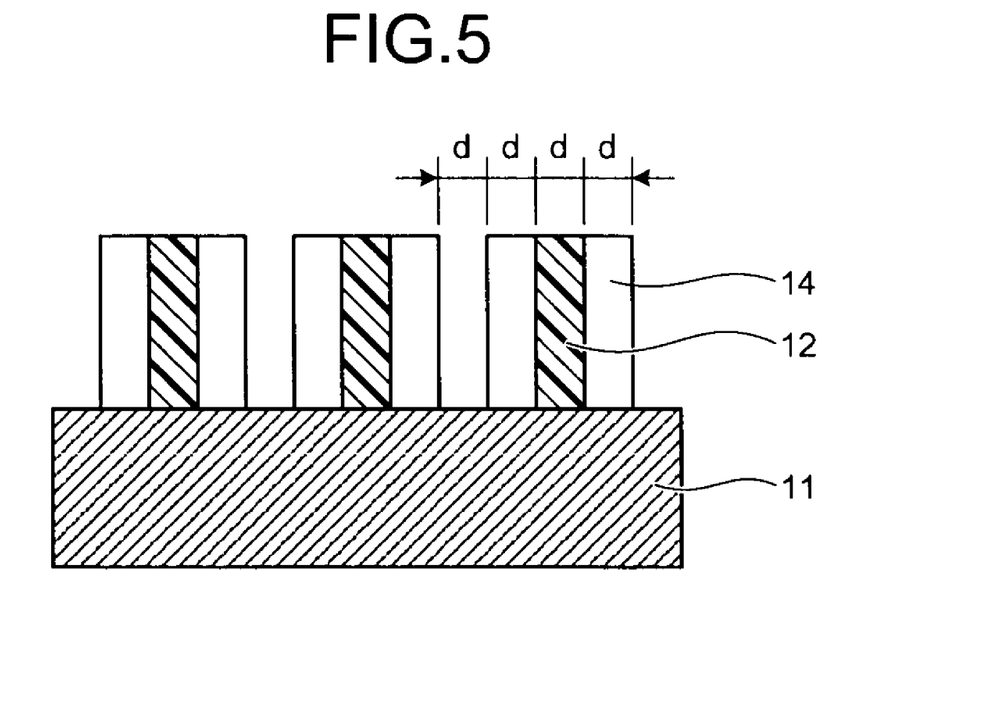
Figure 6:
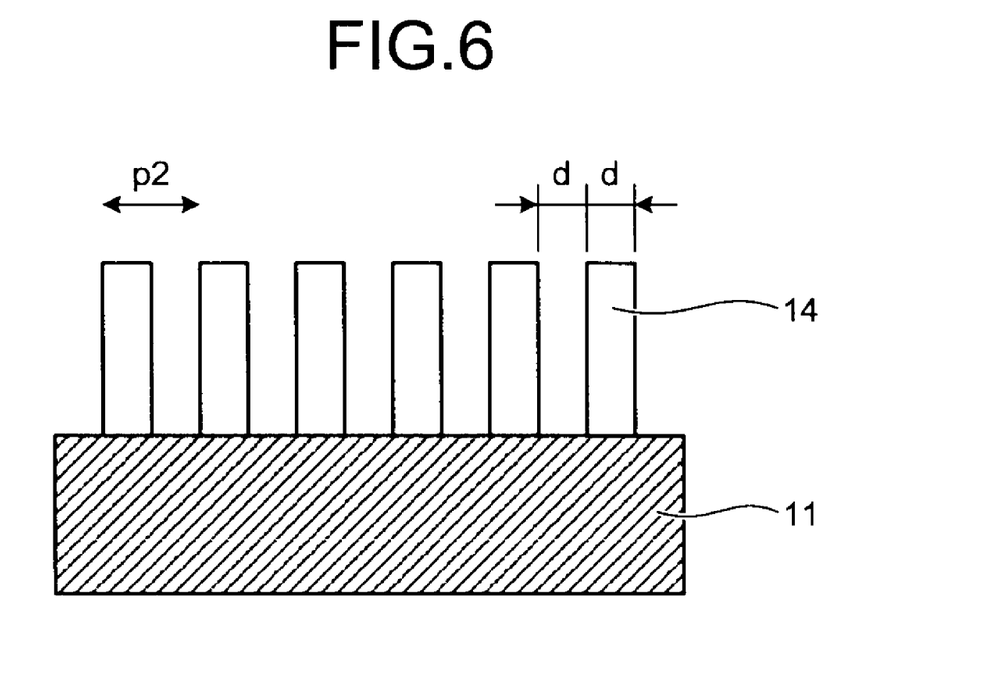

In a process shown in FIG. 4, the layer 11 and the sacrifice layer 12 are coated with a sidewall layer 14. A film thickness of the sidewall layer 14 shall be identical to the line width d of the sacrifice layer 12. In a process shown in FIG. 5, the sidewall layer 14 is etched back until a surface of the sacrifice layer 12 is exposed. As a result, the sidewall layers 14 (second layers) of the width d are formed on side walls of the line portions of the sacrifice layer 12 as a core member. Space portions of a width d are formed between the sidewall layers 14. In a process shown in FIG. 6, the sacrifice layer 12 is removed, and the sidewall layers 14 remain on the layer 11. A portion where the sacrifice layer 12 is removed becomes space portions of a space width d. In other words, the sidewall layers 14 form a line-and-space pattern that the line width and the space width are both d. A pitch of one line portion and one space portion of the sidewall layers 14 shall be referred to as a second pitch p2. The second pitch p2 corresponds to a width 2d, and is half the length of the first pitch p1.

Figure 7:
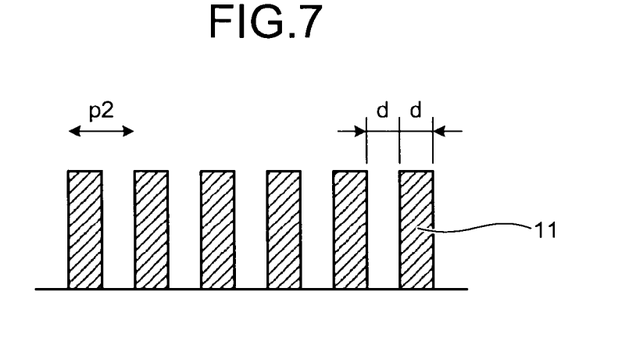

In a process shown in FIG. 7, the layer 11 is patterned by using the sidewall layers 14 as a mask. In this manner, a wiring pattern structure (a first pattern structure) including line portions and space portions with the second pitch p2 is formed. Incidentally, the first pattern structure can be the one that an insulating layer is formed by a sidewall fabrication process. In this case, the insulating layer can be formed by using the layer 11 as an insulating material in accordance with the same procedure as described above, or the sidewall layer 14 formed by using an insulating material can be used as the insulating layer. Wiring material layers are formed in the space portions of the line-and-space pattern composed of the insulating layer, and thereby obtaining a wiring pattern structure.

Figure 8:
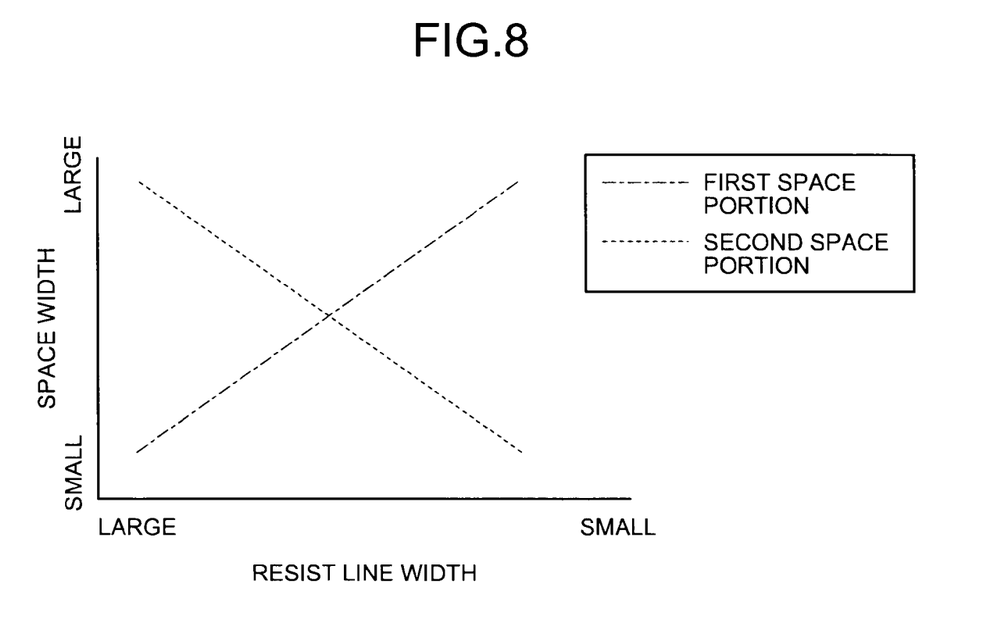
FIGS. 8 and 9 are a graph and a schematic diagram for explaining displacement of line portions.
Figure 9:
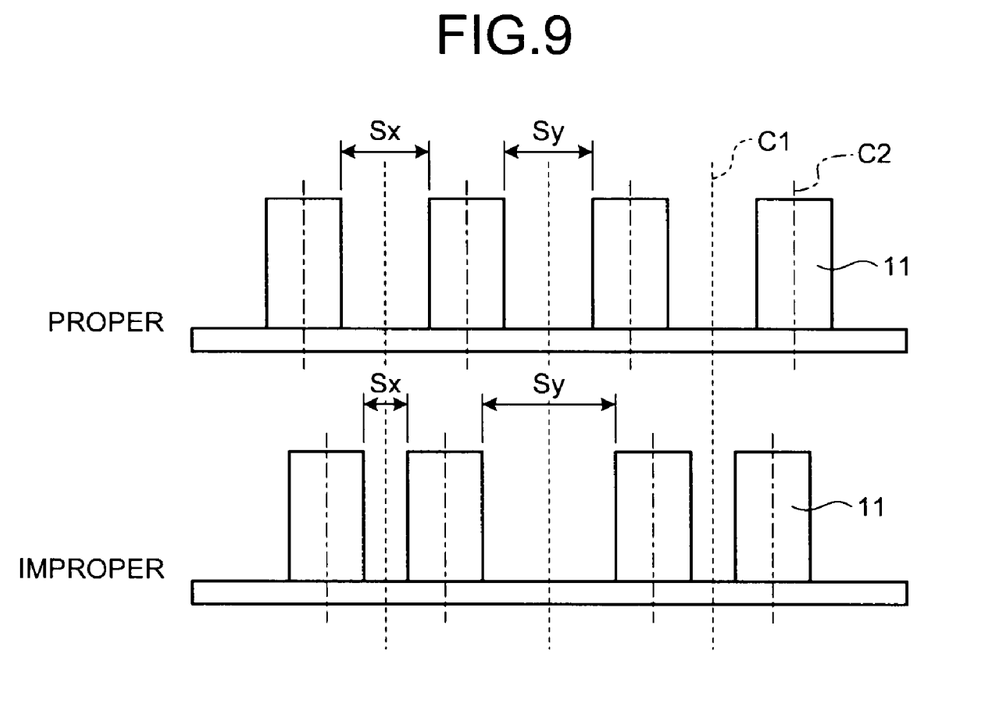

FIGS. 8 and 9 are a graph and a schematic diagram for explaining displacement of line portions that may be caused by the sidewall fabrication process. In this example, out of the first pattern structure, a space portion derived from the space portion of the sacrifice layer 12 as the first layer is referred to as a first space portion, and a space portion derived from the line portion of the sacrifice layer 12 is referred to as a second space portion. In the graph shown in FIG. 8, a vertical axis indicates a width of each of the first space portion and the second space portion, and a horizontal axis indicates a width of the line portion of the resist layer 13 (see FIG. 2). An error in the line width of the resist layer 13 may occur, for example, depending on how far the slimming process is performed. As the line width of the resist layer 13 gets larger, the line width of the sacrifice layer 12 also gets larger. When the line width of the sacrifice layer 12 is large, the width of the first space portion becomes small, and the width of the second space portion becomes large. On the other hand, as the line width of the resist layer 13 gets smaller, the line width of the sacrifice layer 12 also gets smaller. When the line width of the sacrifice layer 12 is small, the width of the first space portion becomes large, and the width of the second space portion becomes small. In this manner, the second pitch p2 (see FIG. 7) in the first pattern structure is not always constant, and varies depending on a degree of displacement of the line portions.

As shown in FIG. 9, a center position C1 of each of the space portions in the first pattern structure is not shifted regardless of the error in the line width of the resist layer 13. However, a center position C2 of each of the line portions in the first pattern structure is shifted due to the error in the line width of the resist layer 13. Therefore, if there is no error in the line width of the resist layer 13, it is in a proper state that a width Sx of the first space portion is equal to a width Sy of the second space portion. On the other hand, if there is any error in the line width of the resist layer 13, it is in an improper state that the width Sx of the first space portion is different from the width Sy of the second space portion.

Figure 10A:
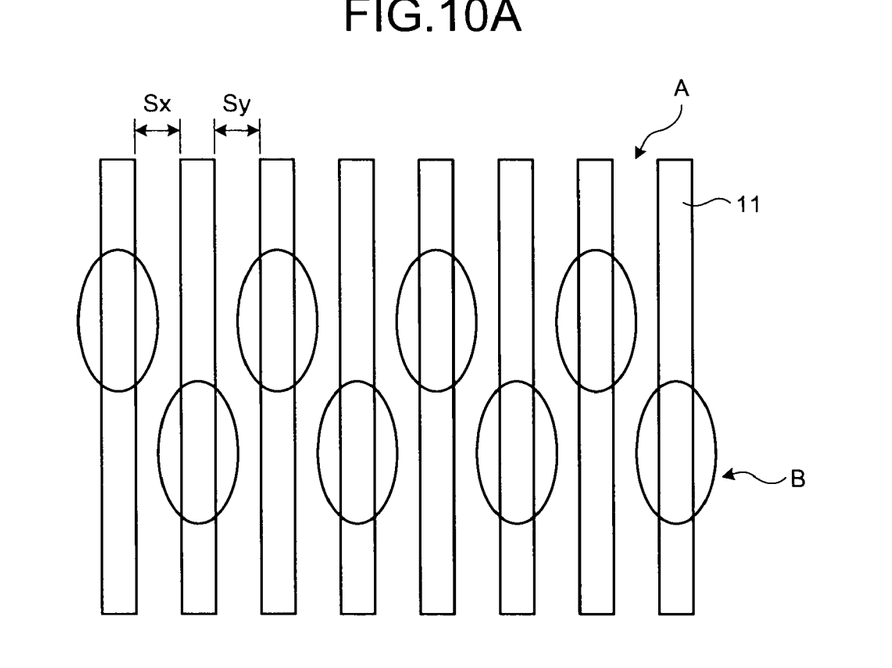
FIGS. 10A and 10B are schematic diagrams for explaining a relation between overlay of patterns and displacement of line portions.
Figure 10B:
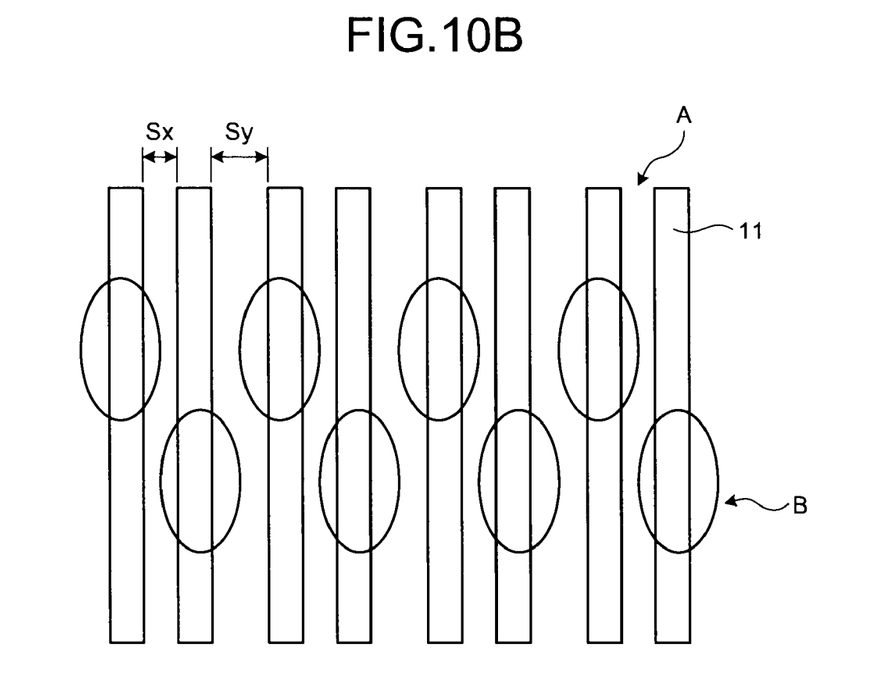

FIGS. 10A and 10B are schematic diagrams for explaining a relation between overlay of a first pattern structure A and a second pattern structure B and displacement of line portions occurring in the first pattern structure A. The second pattern structure B is formed by overlay exposure onto the first pattern structure A. The second pattern structure B is, for example, a contact hole pattern formed in an insulating layer that covers a whole surface including the first pattern structure A in accordance with a wiring pattern. As shown in FIG. 10A, when a width Sx of a first space portion of the first pattern structure A is equal to a width Sy of a second space portion, it is possible to overlay the second pattern structure B on the first pattern structure A so that center positions of elements composing the second pattern structure B coincide with those of the second pattern structure A.

On the other hand, as shown in FIG. 10B, when it is in an improper state that the width Sx of the first space portion of the first pattern structure A is different from the width Sy of the second space portion, the center positions of the elements composing the second pattern structure B do not coincide with those of the second pattern structure A. For example, as shown in 10B, holes of the second pattern structure B are out of line alternately to the left and to the right with respect to the line portions of the first pattern structure A. If either one of the adjacent two line portions is set so that the center position of the line portion coincides with the center position of the corresponding contact hole, displacement of the other line portion with respect to the corresponding contact hole gets larger.

Figure 11:
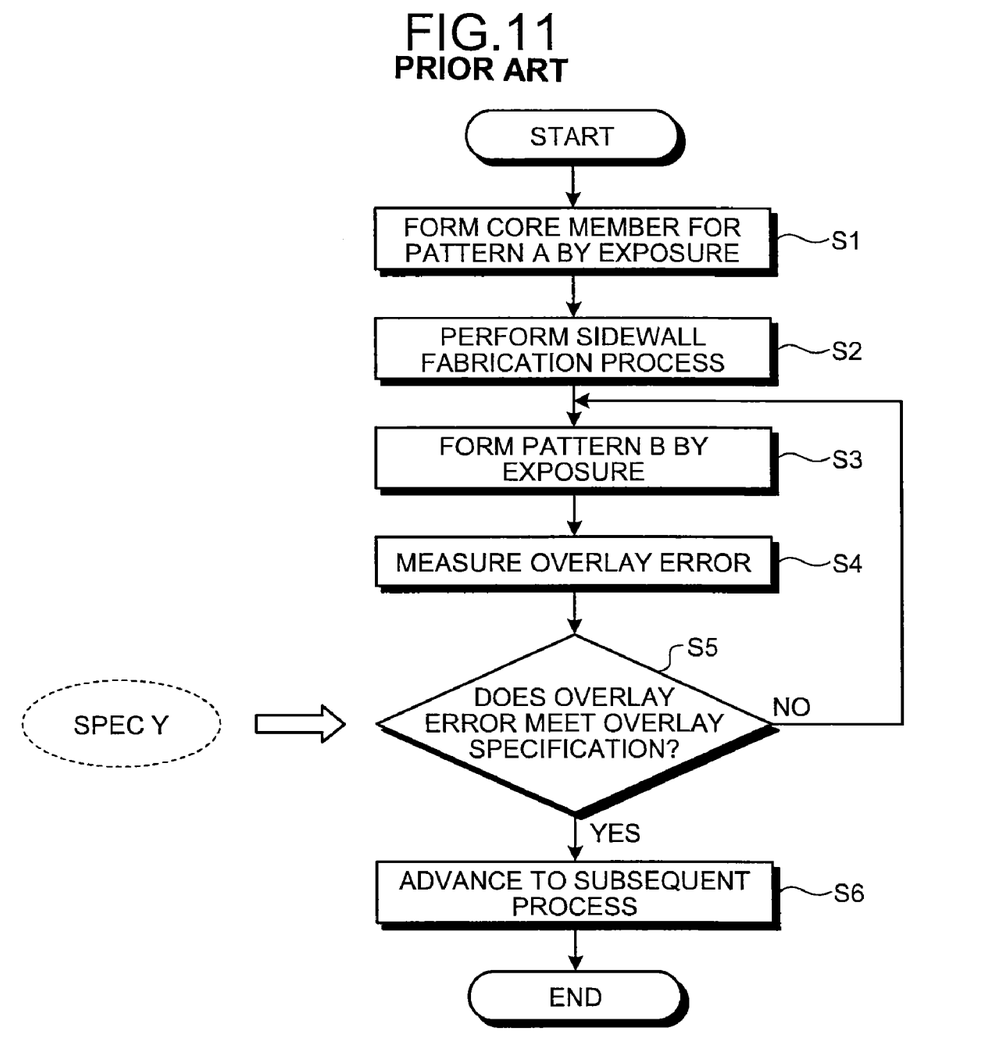
FIG. 11 is a flowchart of a procedure of a conventional fabrication process.

FIG. 11 is a flowchart of a procedure of a conventional fabrication process as a comparative example. A core member for a pattern of a first pattern structure A (hereinafter, "a pattern A") is formed by exposure (Step S1). Incidentally, in the sidewall fabrication process described above, the sacrifice layer 12 shown in FIG. 3 corresponds to the core member. A sidewall fabrication process is performed with the core member (Step S2), and the first pattern structure A is formed.

After an insulating layer that, for example, contact holes are to be formed on its whole surface including the first pattern structure A is formed, photoresist is applied onto the insulating layer, and a pattern of a second pattern structure B (hereinafter, "a pattern B") is formed on the photoresist by overlay exposure (Step S3). Then, an overlay error of the pattern A and the pattern B is measured (Step S4). Whether the overlay error measured at Step S4 meets an overlay specification (a spec Y) is determined (Step S5). When the overlay error meets the overlay specification (YES at Step S5), the flow advances to a subsequent process (Step S6). On the other hand, when the overlay error does not meet the overlay specification (NO at Step S5), the flow returns to Step S3 (reworking).

There is no means for correcting the displacement in the first pattern structure A, and an amount of displacement varies among products. If the overlay specification (the spec Y) used at Step S5 is uniformly tightened by adding an amount of possible displacement caused by the sidewall fabrication, an exposure device having a high overlay accuracy is required at Step S3, which results in an increase in cost.

Figure 12:
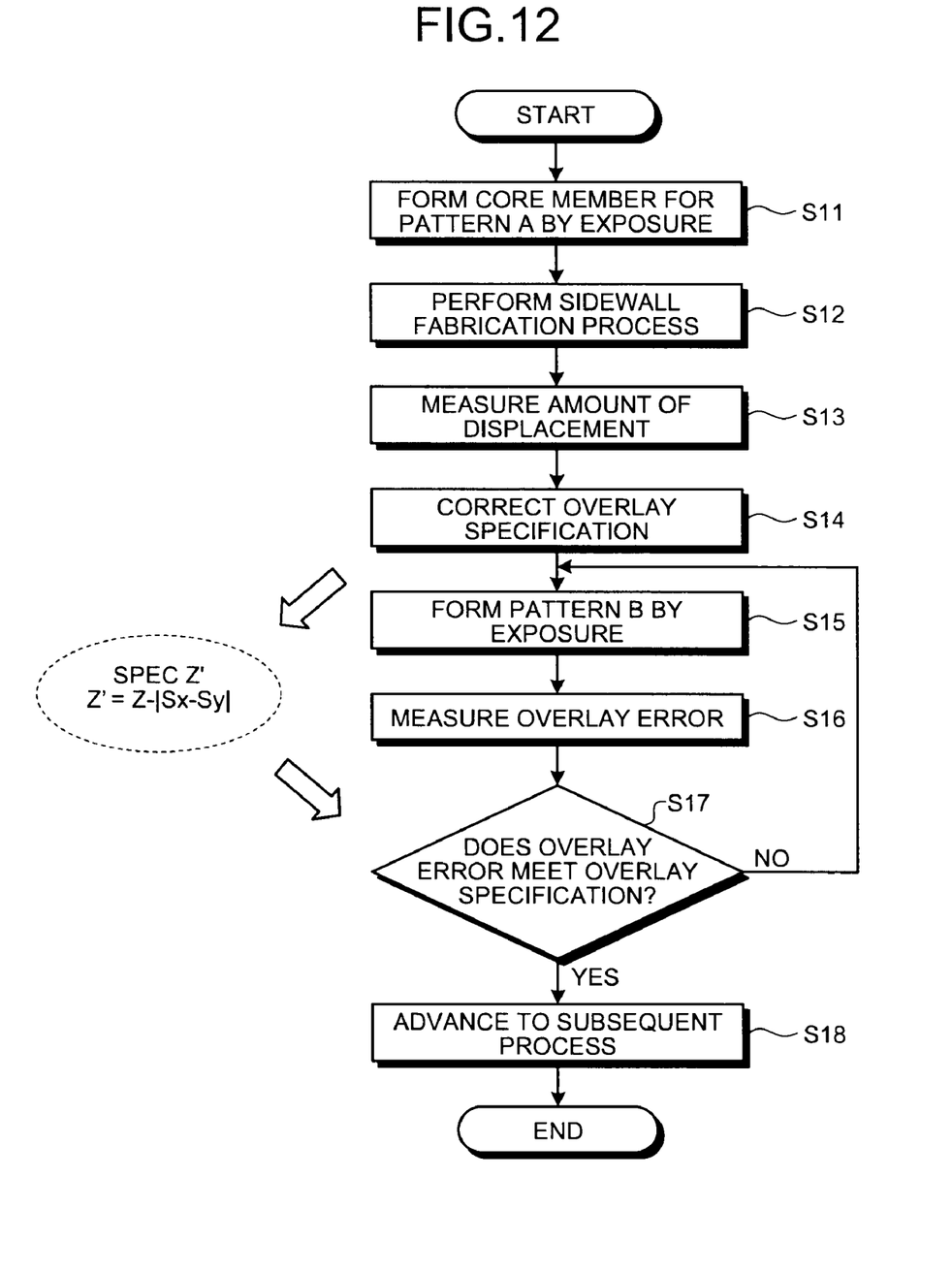
FIG. 12 is a flowchart of a procedure of a fabrication process according to a first embodiment of the present invention.

FIG. 12 is a flowchart of a procedure of a fabrication process according to a first embodiment of the present invention. A core member for a pattern A is formed by exposure (Step S11). A sidewall fabrication process is performed with the core member (Step S12), and a first pattern structure A is formed. An amount of displacement of line portions in the first pattern structure A is measured (Step S13).

As an amount of displacement, an absolute value of a difference between the width Sx of the first space portion and the width Sy of the second space portion shown in FIG. 10B ($|Sx-Sy|$) is used. For the measurement of an amount of displacement, for example, a scanning electron microscope (SEM), an atomic force microscope (AFM), or the like is used. Incidentally, in this case, there is no need to make a distinction between the first space portion and the second space portion.

An overlay specification is corrected based on the measured amount of displacement (Step S14). The corrected overlay specification (a spec Z') shall be, for example, a difference between a predetermined overlay specification (a spec Z) used in a normal fabrication other than the sidewall fabrication and the amount of displacement $|Sx-Sy|$. When there is no displacement ($|Sx-Sy|=0$), the spec Z' is identical to the spec Z. When the amount of displacement is a possible maximum value, the spec Z' is identical to the spec Y used in the conventional sidewall fabrication. The spec Y is the overlay specification that a maximum value of an amount of possible displacement caused by the sidewall fabrication is added to the spec Z.

Then, an insulating layer (a upper layer to be processed) made of an insulating material is formed on a whole surface including the first pattern structure A. A resist layer is formed on the insulating layer, and a pattern B is formed on the resist layer by overlay exposure (Step S15). Then, an overlay error of the pattern A and the pattern B is measured (Step S16). Whether the overlay error measured at Step S16 meets the spec Z' is determined (Step S17). When the overlay error meets the spec Z' (YES at Step S17), the flow advances to a subsequent process, and the contact hole pattern B is transferred onto the insulating layer by using the resist layer as a mask (Step S18). On the other hand, when the overlay error does not meet the spec Z' (NO at Step S17), the flow returns to Step S15 (reworking).

Incidentally, an amount of displacement shall be measured with respect to each product, and an overlay specification is dynamically corrected based on the amount of displacement with respect to each product. The correction of the overlay specification is not limited to a subtraction of an amount of displacement from an overlay specification used in a normal fabrication. The overlay specification can be corrected by other methods, for example, root mean square. Furthermore, the overlay specification can be relaxed, for example, by adding a correction amount depending on the amount of displacement $|Sx-Sy|$ to the spec Y.

According to the present embodiment, it is possible to inspect an overlay error in consideration of displacement caused when a line-and-space pattern is formed by a sidewall fabrication process, and also possible to enhance yield. Furthermore, there is no need for uniform tightening of the overlay specification, and thereby reducing a reworking rate. Moreover, it is possible to suppress an overlay accuracy required of an exposure device, and thus it is possible to reduce the cost. Consequently, it is possible to improve the productivity. The present embodiment is not limited to a case where a contact hole pattern is overlaid above a wiring pattern, and can be widely applied to fabrication that a pattern is overlaid above a line-and-space pattern.

Figure 13:
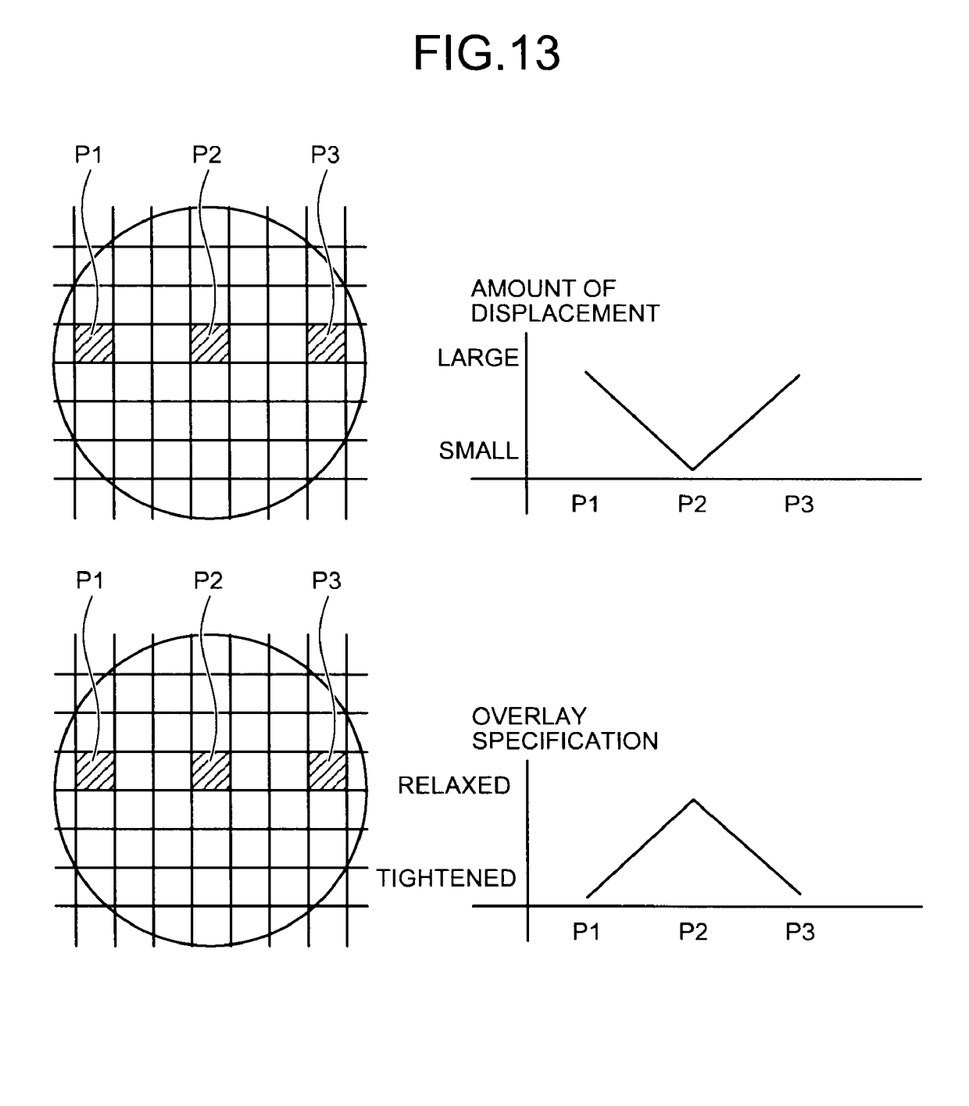
FIG. 13 is a conceptual diagram for explaining a second embodiment of the present invention.

FIG. 13 is a conceptual diagram for explaining a second embodiment of the present invention. In the second embodiment, an overlay specification is corrected based on amounts of displacement at a plurality of measure points in a first pattern structure A. As the amount of displacement is larger, the overlay specification is corrected more rigorously. For example, as shown on the upper left in FIG. 13, out of amounts of displacement measured at three measure points P1, P2, and P3 based on process variations in a wafer surface at the time of a slimming process of a resist layer or the like, it is assumed that the amounts of displacement measured at the measure points P1 and P3 are large, and the amount of displacement measured at the measure point P2 is small as shown in a graph on the upper right in FIG. 13. The result of measurement is directly reflected in the overlay specification with respect to three measure points P1, P2, and P3 shown on the lower left in FIG. 13 so that the overlay specification is tightened with respect to the measure points P1 and P3 and relaxed with respect to the measure point P2 as shown in a graph on the lower right in FIG. 13. Therefore, the overlay specification can be appropriately corrected depending on an amount of in-plane displacement.

In the present embodiment, an amount of displacement with respect to each point on the first pattern structure A can be presumed based on a result of measurement of amounts of displacement, and the overlay specification can be corrected based on the presumed amount of displacement. An amount of displacement is presumed, for example, by polynomial approximation based on a result of measurement of amounts of displacement at a plurality of measure points. Therefore, the overlay specification can be appropriately corrected based on a result of measurement of amounts of displacement at a few measure points. Incidentally, an amount of displacement can be presumed by any conventional techniques other than the polynomial approximation.

Figure 14:
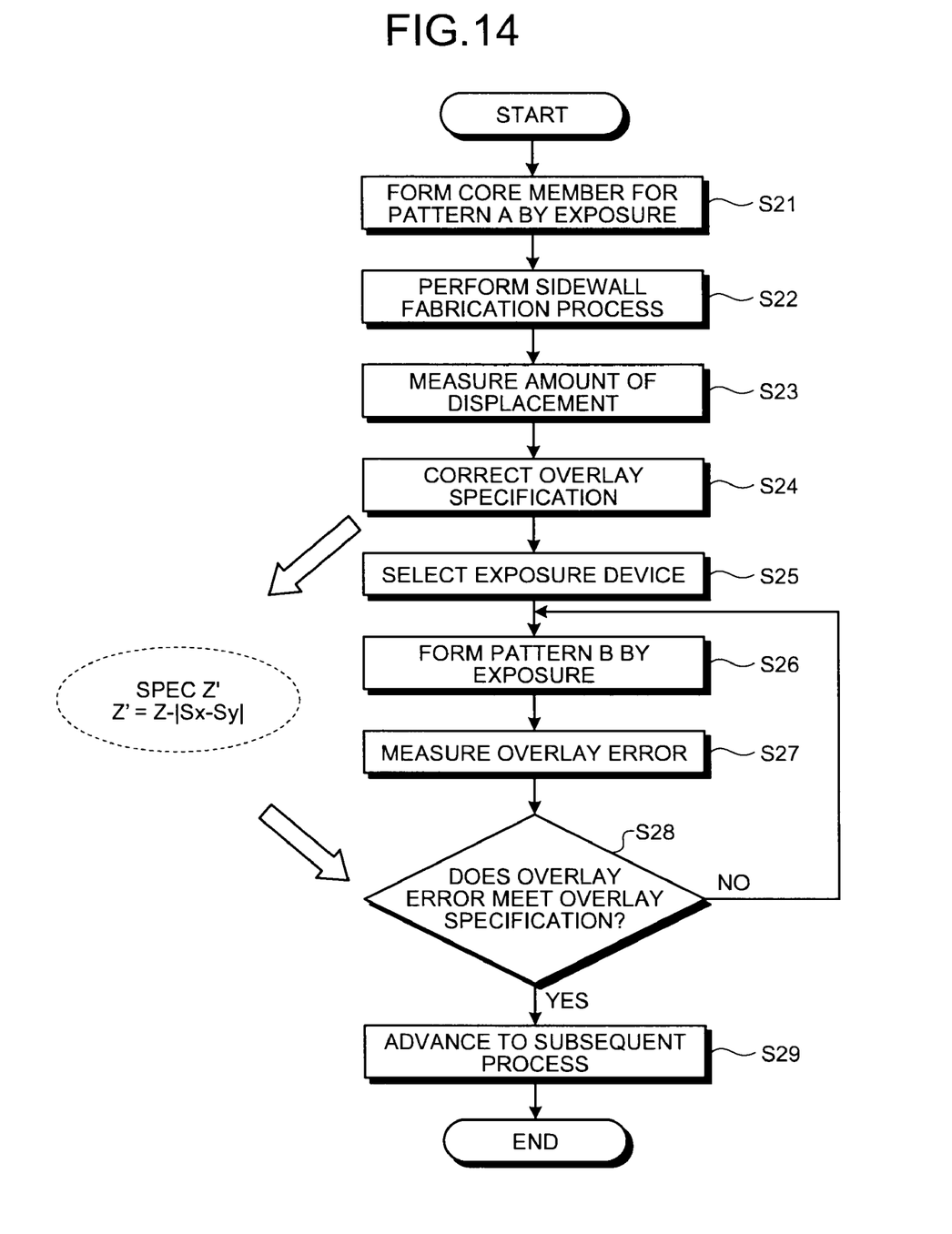
FIG. 14 is a flowchart of a procedure of a fabrication process according to a third embodiment of the present invention.

FIG. 14 is a flowchart of a procedure of a fabrication process according to a third embodiment of the present invention. In the third embodiment, an exposure device for forming a second pattern structure B is selected depending on a corrected overlay specification. A core member for a pattern A is formed by exposure (Step S21). A sidewall fabrication process is performed with the core member (Step S22), and a first pattern structure A is formed. An amount of displacement of line portions in the first pattern structure A is measured (Step S23).

Figure 15:
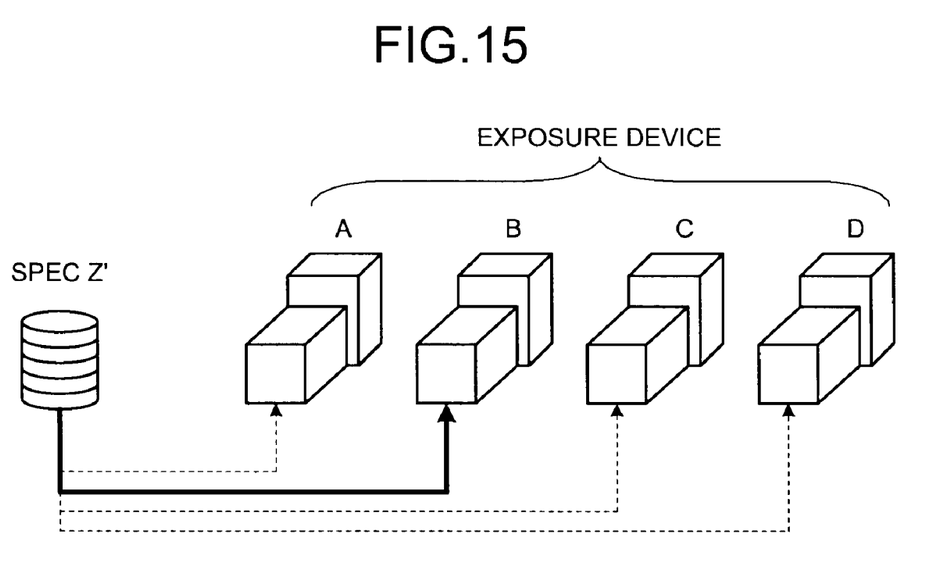
FIG. 15 is a schematic diagram for explaining how to select an exposure device.

The overlay specification is corrected based on the measured amount of displacement (Step S24). An exposure device for overlaying a pattern B on the pattern A is selected from a plurality of exposure devices depending on the corrected overlay specification (Step S25). For example, as shown in FIG. 15, four exposure devices A, B, C, and D are prepared in advance. For example, the exposure devices to be prepared have different overlay accuracy characteristics appropriately. The exposure device is selected depending on an overlay accuracy required for the overlay specification corrected based on an amount of displacement (the spec Z'). In the present embodiment, it is assumed that the exposure device B having the optimum characteristics depending on the spec Z' is selected.

After an insulating layer is formed on a whole surface, photoresist is applied onto the first pattern structure A, and a pattern B is formed by overlay exposure by the exposure device B (Step S26). Then, an overlay error of the pattern A and the pattern B is measured (Step S27). Whether the overlay error measured at Step S27 meets the spec Z' is determined (Step S28). When the overlay error meets the spec Z' (YES at Step S28), the flow advances to a subsequent process (Step S29). On the other hand, when the overlay error does not meet the spec Z' (NO at Step S28), the flow returns to Step S26 (reworking). In the present embodiment, the exposure device appropriate to the corrected overlay specification can be arbitrarily selected, so that it is possible to form the pattern B efficiently. Thus, it is possible to improve the productivity.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor-device manufacturing method comprising:
    forming a first layer including a line portion and a space portion with a first pitch above a lower layer to be processed;
    forming a second layer on each of side walls of the line portion of the first layer;
    removing the first layer thereby making the second layer into a layer including line portions and space portions with a second pitch smaller than the first pitch;
    patterning the lower layer by using the second layer as a mask thereby forming a first pattern structure on the lower layer including line portions and space portions with the second pitch;
    measuring an amount of displacement of the line portions of the first pattern structure based on a width of each of a first space portion and a second space portion among the space portions of the first pattern structure, the first space portion being derived from the space portion of the first layer, and the second space portion being derived from the line portion of the first layer;
    correcting an overlay specification for an overlay of the first pattern structure and a second pattern structure formed to be overlaid above the first pattern structure dynamically based on the amount of displacement; and
    determining whether an error in the overlay of the first pattern structure and the second pattern structure meets a corrected overlay specification, wherein the amount of displacement is an absolute value of a difference between the width of the first space portion and the width of the second space portion.

2. The semiconductor-device manufacturing method according to claim 1, wherein the second pitch is half the length of the first pitch.

3. The semiconductor-device manufacturing method according to claim 1, wherein a film thickness of the second layer formed on each of the side walls of the line portion of the first layer is substantially equal to a width of the line portion of the first layer.

4. The semiconductor-device manufacturing method according to claim 1, wherein the corrected overlay specification is identical to a difference between a predetermined overlay specification and the amount of displacement.

5. The semiconductor-device manufacturing method according to claim 1, wherein
    measurement of an amount of displacement of the line portions of the first pattern structure is made with respect to each product, and
    correction of the overlay specification is made with respect to each product.

6. The semiconductor-device manufacturing method according to claim 1, wherein
    measurement of an amount of displacement of the line portions of the first pattern structure is made at a plurality of measure points on the first pattern structure, and
    the overlay specification is corrected based on the amount of displacement measured at each of the measure points.

7. The semiconductor-device manufacturing method according to claim 6, wherein as the amount of displacement is larger, the overlay specification is corrected more rigorously.

8. The semiconductor-device manufacturing method according to claim 6, wherein
    an amount of displacement of the line portions of the first pattern structure with respect to each point on the first pattern structure is presumed based on a result of the measurement of the amount of displacement, and
    the overlay specification is corrected based on presumed amount of displacement.

9. The semiconductor-device manufacturing method according to claim 8, wherein the presumed amount of displacement is obtained by polynomial approximation based on the result of the measurement at each of the measure points.

10. The semiconductor-device manufacturing method according to claim 1, further comprising selecting an exposure device for forming the second pattern structure from a plurality of exposure devices depending on the corrected overlay specification.

11. The semiconductor-device manufacturing method according to claim 10, wherein the selecting includes selecting an exposure device for forming the second pattern structure depending on an overlay accuracy required for the corrected overlay specification.

12. The semiconductor-device manufacturing method according to claim 1, wherein the forming the first layer includes performing a slimming process.

13. The semiconductor-device manufacturing method according to claim 12, wherein
    the forming the first layer includes:
        forming a resist including a line portion and a space portion with the first pitch by performing the slimming process; and
        patterning the first layer by using the resist as a mask.

14. A semiconductor-device manufacturing method comprising:
- forming a sacrifice layer including a line portion and a space portion with a first pitch above a lower layer to be processed;
- forming a sidewall layer on each of side walls of the line portion of the sacrifice layer;
- removing the sacrifice layer thereby making the sidewall layer into a layer including line portions and space portions with a second pitch smaller than the first pitch;
- patterning the lower layer by using the sidewall layer as a mask thereby forming a first pattern structure of the lower layer including line portions and space portions with the second pitch;
- measuring an amount of displacement of the line portions of the first pattern structure based on a width of each of a first space portion and a second space portion among the space portions of the first pattern structure, the first space portion being derived from the space portion of the sacrifice layer, and the second space portion being derived from the line portion of the sacrifice layer;
- correcting an overlay specification for an overlay of the first pattern structure and a second pattern structure formed to be overlaid above the first pattern structure dynamically based on the amount of displacement;
- forming a upper layer to be processed above the first pattern structure;
- forming a resist above the upper layer;
- patterning the resist thereby forming the second pattern structure;
- determining whether an error in the overlay of the first pattern structure and the second pattern structure meets a corrected overlay specification; and
- transferring a pattern of the second pattern structure onto the upper layer by using the resist as a mask if the error meets the corrected overlay specification, wherein
the amount of displacement is an absolute value of a difference between the width of the first space portion and the width of the second space portion.

15. The semiconductor-device manufacturing method according to claim 14, wherein
the forming the sacrifice layer includes:
- forming a resist including a line portion and a space portion with the first pitch by performing a slimming process; and
- patterning the sacrifice layer by using the resist as a mask.

16. The semiconductor-device manufacturing method according to claim 14, wherein
the lower layer is made of a wiring material, and
the line portions of the first pattern structure are used as a wiring material layer of a wiring pattern structure.

17. The semiconductor-device manufacturing method according to claim 14, wherein
the lower layer is made of an insulating material, and
a wiring material layer made of a wiring material is formed in the space portions of the first pattern structure thereby obtaining a wiring pattern structure.

18. The semiconductor-device manufacturing method according to claim 14, wherein
the first pattern structure composes a wiring pattern structure including a wiring material layer made of a wiring material,
the upper layer is made of an insulating material, and
the second pattern structure composes a contact hole pattern formed in accordance with the wiring pattern structure.

* * * * *